US012213271B2

(12) United States Patent
Claramunt Blanco et al.

(10) Patent No.: US 12,213,271 B2
(45) Date of Patent: Jan. 28, 2025

(54) HOUSING ASSEMBLY AND METHOD FOR VALIDATING A SEAL OF A HOUSING

(71) Applicant: Lear Corporation, Southfield, MI (US)

(72) Inventors: Jordi Claramunt Blanco, Valls (ES); Angel Molinero Benitez, Valls (ES)

(73) Assignee: LEAR CORPORATION, Southfield, MI (US)

( * ) Notice: Subject to any disclaimer, the term of this patent is extended or adjusted under 35 U.S.C. 154(b) by 207 days.

(21) Appl. No.: 17/935,398

(22) Filed: Sep. 26, 2022

(65) Prior Publication Data
US 2024/0107697 A1 Mar. 28, 2024

(51) Int. Cl.
H05K 5/06 (2006.01)
G01M 3/32 (2006.01)

(52) U.S. Cl.
CPC .................... H05K 5/061 (2013.01)

(58) Field of Classification Search
CPC .................... H05K 5/061; G01M 3/3272
See application file for complete search history.

(56) References Cited

U.S. PATENT DOCUMENTS

| | | | |
|---|---|---|---|
| 7,929,247 B2 | 4/2011 | Uefune et al. | |
| 10,620,132 B2 | 4/2020 | Sitko et al. | |
| 10,878,553 B2 | 12/2020 | Rusch et al. | |
| 2014/0076772 A1* | 3/2014 | Azumi | H05K 5/0052 206/706 |
| 2018/0191883 A1* | 7/2018 | Saimyoji | H05K 7/14 |
| 2023/0254990 A1* | 8/2023 | Yakuzawa | H05K 5/0052 361/752 |

* cited by examiner

Primary Examiner — Hoa C Nguyen
Assistant Examiner — Amol H Patel
(74) Attorney, Agent, or Firm — Brooks Kushman, P.C.

(57) ABSTRACT

A housing assembly is described that includes a first member, a second member having an opening formed therein, and a gasket interposed between the first and second members. The first and second members are attached, a gap between the attached first and second members is exposed by the opening formed in the second member, and a dimension of the gap is indicative of a condition of a seal by the gasket of the second member to the first member.

20 Claims, 4 Drawing Sheets

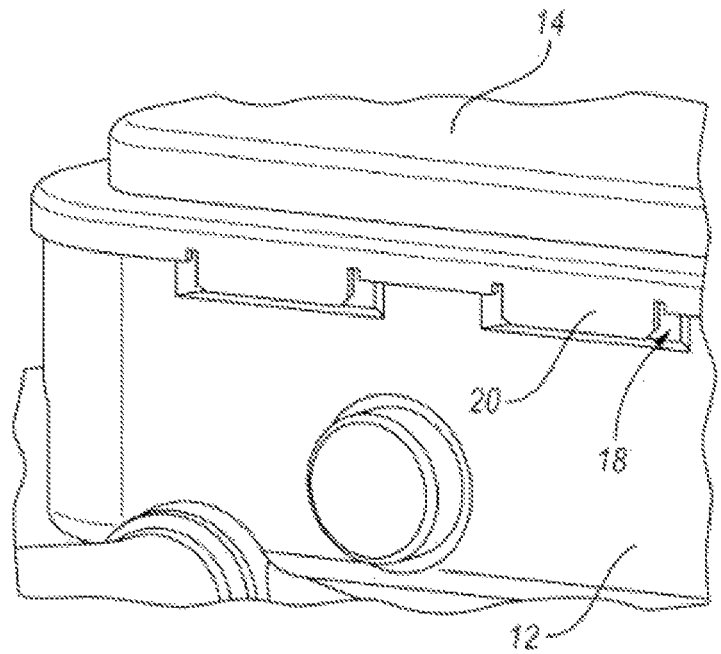
FIG. 2
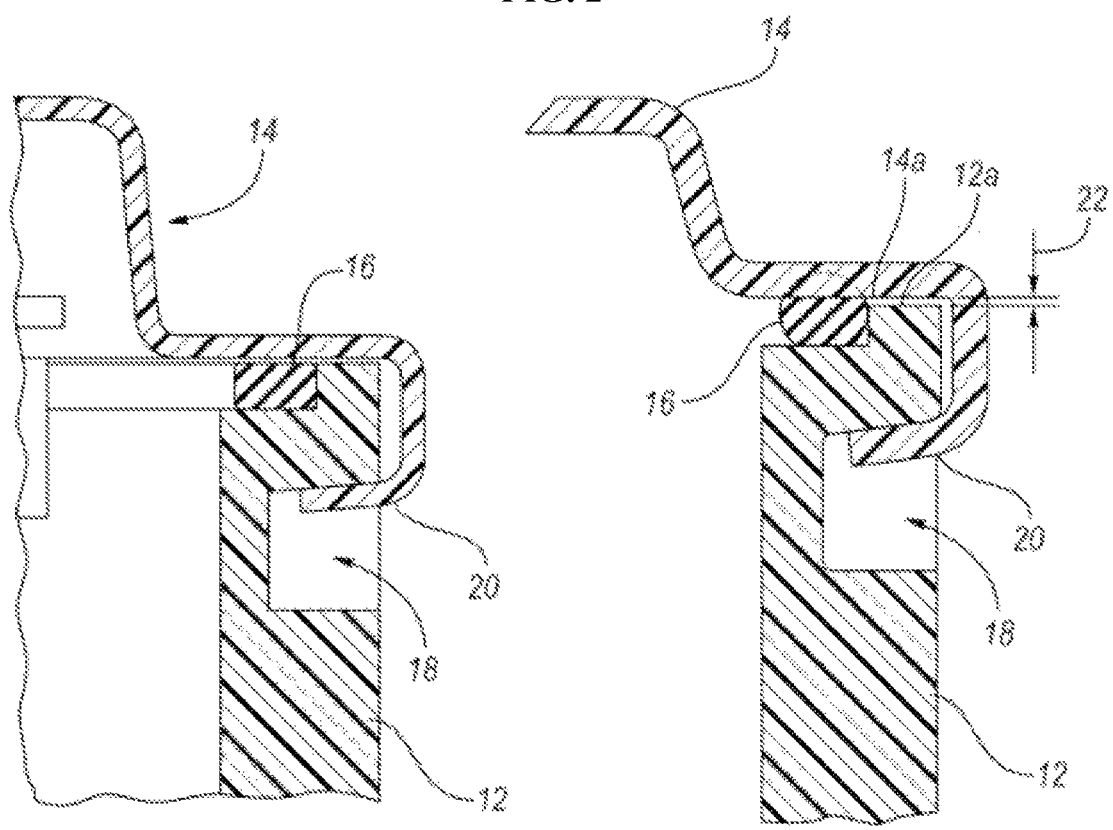
FIG. 3A  FIG. 3B

| GAP (mm) | COMPRESSION % | | |
|---|---|---|---|
| | MIN | MAX | |
| 0 | 27.4% | 34.6% | PASS 36 |
| 0.1 | 24.2% | 31.6% | |
| 0.2 | 21.0% | 28.8% | |
| 0.3 | 17.7% | 25.8% | |
| 0.4 | 14.5% | 22.7% | |
| 0.5 | 11.3% | 19.7% | NO PASS 38 |
| 0.6 | 8.1% | 16.7% | |
| 0.7 | 4.8% | 13.6% | |
| 0.8 | 1.6% | 10.6% | |
| 0.9 | 0.0% | 7.6% | |
| 1.0 | 0.0% | 4.5% | |
| 1.1 | 0.0% | 1.5% | |
| 1.15 | 0.0% | 0.0% | |

HOUSING ASSEMBLY AND METHOD FOR VALIDATING A SEAL OF A HOUSING

TECHNICAL FIELD

The present disclosure relates to a housing assembly and method for validating a seal of a housing.

BRIEF DESCRIPTION OF THE DRAWINGS

FIG. 2 is a partial perspective view of a non-limiting, exemplary embodiment of a housing assembly;

FIGS. 3A and 3B are partial cross-sectional views of non-limiting, exemplary embodiments of housing assemblies;

DETAILED DESCRIPTION

Figure 1:
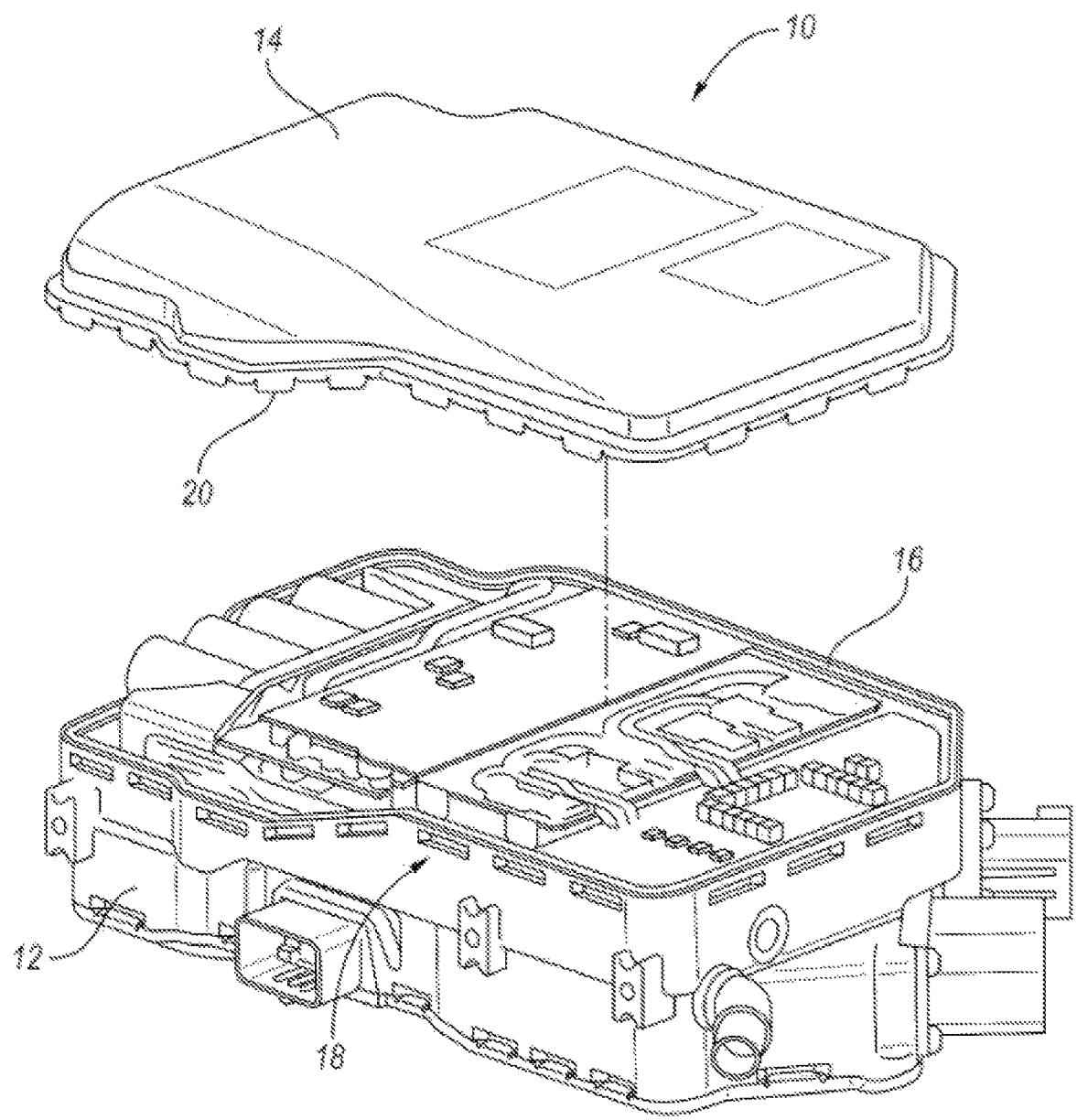
FIG. 1 is a partially exploded perspective view of a non-limiting, exemplary embodiment of a housing assembly.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, features, and elements have not been described in detail so as not to unnecessarily obscure aspects of the embodiments.

It is to be understood that the disclosed embodiments are merely exemplary and that various and alternative forms are possible. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ embodiments according to the disclosure.

"One or more" and/or "at least one" includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or"in response to detecting [the stated condition or event]," depending on the context.

FIG. 1 is a partially exploded perspective view of a non-limiting, exemplary embodiment of a housing assembly. FIG. 2 is a partial perspective view of a non-limiting, exemplary embodiment of a housing assembly. FIGS. 3A and 3B are partial cross-sectional views of non-limiting, exemplary embodiments of housing assemblies.

As seen therein, according to the embodiment or embodiments shown, a housing assembly 10 comprises a housing member or base 12 and another housing member or cover 14. The housing assembly also comprises a gasket 16 interposed between the base 12 and the cover 14. The housing assembly 10 shown is for a vehicle on-board battery charger, but the present disclosure is applicable for or to any type of sealed housing or electronic unit. The base 12 may comprise a metal material or any other type of material (e.g., plastic) suitable for performing or enabling the functions and/or operations described herein or associated therewith. Similarly, the cover 14 may comprise a metal material or any other type of material suitable for performing or enabling the functions and/or operations described herein or associated therewith. The gasket 16 may also comprise any material, such as plastic, rubber, or any other type of material (e.g., a liquid or semi-solid material or paste poured on or applied to the base 12 and/or cover the 14 and which solidifies as a result of a curing process) suitable for sealing or to provide a seal between the base 12 and cover 14 and/or for performing or enabling the functions and/or operations described herein or associated therewith.

The base 12 has one or more cavities 18 formed therein and the cover 14 is provided with one or more corresponding tabs or flaps 20, which are deformable (e.g., metal). Clinching is a process to automatically push the cover 14 closed on the base 12 and/or to automatically attach the cover 14 to the base 12. In a clinching process, each flap 20 of the cover 14 is bent and received into a corresponding cavity 18 formed in the base 12. Such a clinching process draws the cover 14 to the base 12 and compresses the gasket 16 between the base 12 and cover 14 to thereby provide a seal between the cover 14 and the base 12.

To assure satisfactory, proper, sufficient, and/or acceptable sealing or a satisfactory, proper, sufficient and/or acceptable seal of the cover 14 to the base 12, the gasket 16 must be satisfactorily, properly, sufficiently and/or acceptably compressed between the cover 14 and the base 12. However, current clinching processes have allowable tolerances that can lead to inadequate closure pressure on and compression of the gasket 16. In that regard, a dimension (e.g., height) of a gap 22 formed or established between a surface 12*a* of the cover 12 and a surface 14*a* of the base 14 as a result of the clinching process attaching the cover 12 to the base 14 should be less than or equal to a maximum value to thereby assure adequate compression of the gasket 16 between the cover 14 and the base 12, and thus a satisfactory, proper, sufficient, and/or acceptable seal. Thus, compliance of the gap 22 with such a maximum gap threshold value should be verified after the cover 14 is clinched in place on or to the base 12. However, current clinching processes (or any other type of closure, such as using screws) hide the sealing perimeter (i.e., blind). With current clinching processes, it is therefore not possible to evaluate a sealing operation and assure or validate a proper, satisfactory, sufficient, and/or acceptable seal between the cover 14 and the base 12.

Figure 4A:
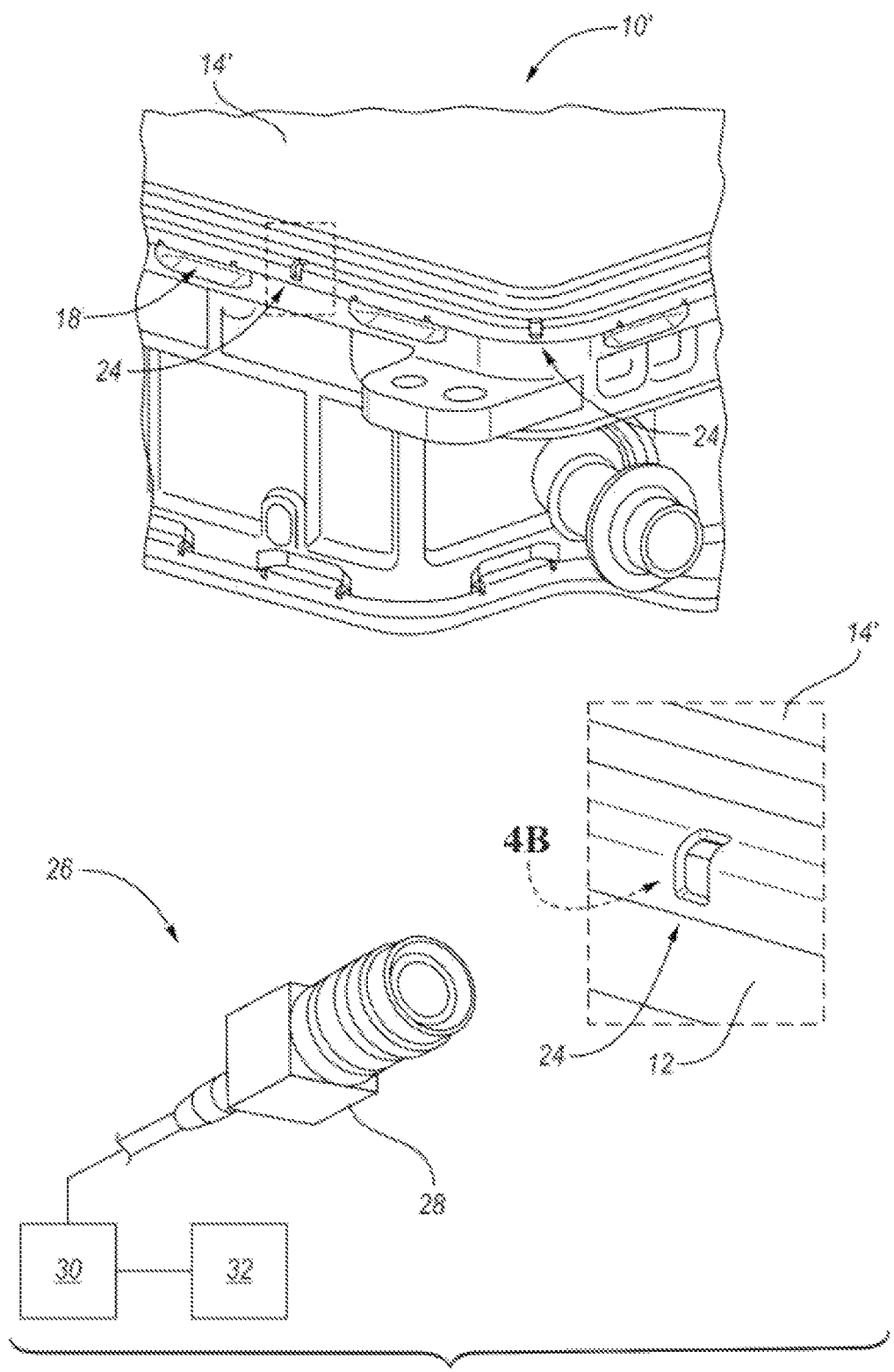
FIGS. 4A and 4B are partial perspective and side views of a non-limiting, exemplary embodiment of a housing assembly and method according to the present disclosure.
Figures 4B, 5:
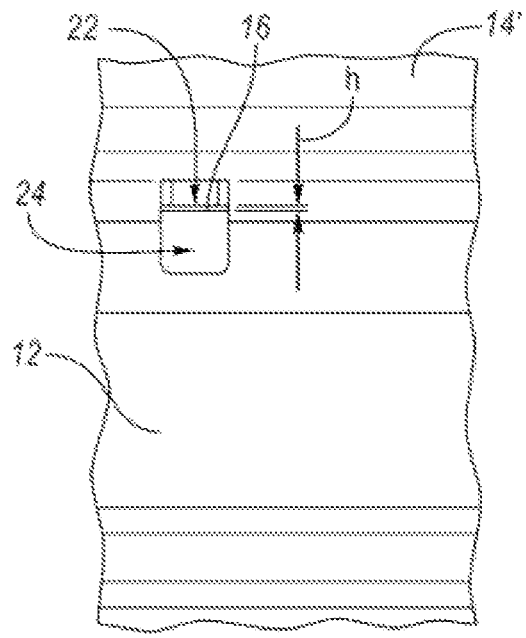
FIG. 5 is an exemplary table illustrating a non-limiting, exemplary embodiment of a method according to the present disclosure.

FIGS. 4A and 4B are partial perspective and side views of a non-limiting, exemplary embodiment of a housing assembly 10' and method according to the present disclosure. FIG. 5 is an exemplary table illustrating a non-limiting, exemplary embodiment of a method according to the present disclosure. In that regard, the present disclosure provides a housing assembly 10' and method having, enabling, and/or providing capability to verify or validate that the gasket 16 is properly compressed between the cover 14' and the base 12, thus assuring an adequate, satisfactory, and/or proper sealing therebetween.

As seen therein, a cover 14' has been attached to base 12 via a clinching process as described herein (e.g., bending deformable flaps (not shown) of the cover 14' into cavities 18 formed in the base 12). According to the present disclosure, one or more openings 24 is formed in the cover 14' around the perimeter of the housing assembly 10'. While the openings 24 are shown as windows, the openings may alternatively be provided or formed with any other shape (such as a slot or notch). In that regard, the openings 24 are cuts in the exterior of the cover 14' which are formed, sized, and/or located in the cover 14' without affecting either the closure surfaces 12*a*, 14*a* of the cover 14' or the base 12 (see FIGS. 3A-3B), or the clinching elements, i.e., the cavities 18 formed the base 12 or the flaps (not shown) of the cover 14'. It should be noted that alternative configurations of a base and cover different than that shown could alternatively have openings 24 provided in the base or in both the cover and the base.

With reference to the enlarged portion of FIG. 4A and to FIG. 4B, the openings 24 serve as inspection windows in the cover 14' that enable or facilitate automatic inspection of the gasket 16 by an imaging system 26 in an assembly line for the housing assembly to ensure proper sealing operation. In that regard, the imaging system 26 may comprise one or more cameras 28 (or any suitable imaging device, such as a laser scanner), a controller 30, and a display 32. Thus, according to the present disclosure, the openings 24 surrounding or along the perimeter of the closure (but outside it) between the cover 14' and the base 12 enable or facilitate one or more cameras 28 of an imaging system 26 to capture one or more images of the gap 22 after a clinching process is completed, which captured images are inspected or processed by the controller 30 to determine whether the gasket 16 is properly compressed and provides the expected sealing between the cover 14' and the base 12. According to the present disclosure, adding one or more openings 24 at the periphery of the cover 14' enables a visual inspection of the gap 22 by an imaging system 26. That is, the cover 14' has openings 24 through or via which the imaging system 26 is enabled to "see" the gap 22 between the cover 14' and the base 12 after completion of a clinching process. As previously noted, the openings 24 are formed (e.g., sized and/or located) in the cover 14' so as not to affect the closure pressure and are placed outside the pressing surfaces 12*a*, 14*a* (see FIGS. 3A-3B). The imaging system 26 in the assembly line for the housing assembly 10' enables measurement of the gap 22 at each opening 24 and sets pass/fail (no-pass) criteria to determine the adequacy or acceptance of the seal formed by the gasket 16 between the cover 14' and the base 12.

More specifically, according to the present disclosure, an assembly line for the housing assembly 10' is provided with one or more imaging devices or cameras 28 that, after the clinching phase, capture images of the openings 24. The controller 30 includes a software algorithm which is employed to process the captured images to determine whether the dimension (e.g., height, "h") of the gap 22 between surface 14*a* of the cover 14' and the surface 12*a* of the base 12 is less than or equal to a maximum threshold value, thereby indicating that the gasket 16 is properly, adequately, sufficiently, and/or satisfactorily compressed and the seal between the cover 14' and the base 12 is good (e.g., pass/acceptable/satisfactory/sufficient), or to determine whether the dimension (e.g., height, "h") of the gap 22 between surface 14*a* of the cover 14' and the surface 12*a* of the base 12 is greater than the maximum threshold value, thereby indicating that the gasket 16 is not properly, adequately, sufficiently, and/or satisfactorily compressed and the seal between the cover 14' and the base 12 is not good (e.g., fail/unacceptable/unsatisfactory/insufficient). As those skilled in the art will understand, the imaging system 26, including camera(s) 28, controller 30, and/or display 32, as well as any other controller, unit, component, module, system, subsystem, interface, sensor, device, or the like described herein may individually, collectively, or in any combination comprise appropriate circuitry, such as one or more appropriately programmed processors (e.g., one or more microprocessors including central processing units (CPU)) and associated memory, which may include stored operating system software, firmware, and/or application software executable by the processor(s) for controlling operation thereof and for performing the particular algorithm or algorithms represented by the various methods, functions and/or operations described herein, including interaction between and/or cooperation with each other.

As seen in FIG. 5, for a given gasket 16, measured gaps 22 between the cover 14' and the base 12 of 0.0 to 0.4 millimeters correspond to the compression percentages 34 of the gasket 16 shown and indicate an acceptable, proper, sufficient, and/or satisfactory seal between the cover 14' and the base 12 (i.e., "pass" 36). Conversely, measured gaps 22 between the cover 14' and the base 12 of 0.5 to 1.15 millimeters correspond to compression percentages 34 of the gasket 16 indicating an unacceptable, improper, insufficient, and/or unsatisfactory seal between the cover 14' and the base 12 (i.e., "no pass" 38). The measured gap 22 thus represents, corresponds to, or acts as a proxy for a compression of the gasket 16 resulting from a clinching process attaching the cover 14' to the base 12. In that regard, it should be noted that while compression percentage ranges corresponding to a gap 22 of 0.5 and 0.6 millimeters include some values that are also within the compression percentage range 34 corresponding to an acceptable gap 22 of 0.4 millimeters, a gap 22 of 0.5 or 0.6 millimeters is nevertheless designated as "no pass" because some values within the corresponding compression percentages 34 for such a gap 22 could and/or would be insufficient or inadequate to establish or create a proper seal between the cover 14' and the base 12.

In that regard, the controller 30 and/or software algorithm for measuring the dimension (e.g., height, "h") of the gap 22 formed between the surface 12a of the base 12 and the surface 14a of the cover 14' as a result of a clinching process may utilize known, pre-stored dimensions and/or empirical data associated with a specific gasket 16 (e.g., type and/or physical characteristics of the material) and/or specific characteristics of a cover 14' (e.g., thickness of the cover 14' and/or dimension(s) of the openings 24) and base 12 in order to determine and/or measure the dimension (e.g., height) of a gap 22 (e.g., by comparison with known dimensions of the associated cover 14' or openings 24 also shown in a captured image) and/or a compression percentage corresponding to a measured gap 22. Thus, according to the present disclosure, an inspection step is added to the assembly process for a housing assembly 10' having the openings 24 as described herein. The present disclosure thereby provides for automatic verification or validation of closure sealing, with no or negligible extra cost added to a product.

Item 1: According to an embodiment, the present disclosure provides a housing assembly comprising a first member, a second member having an opening formed therein, and a gasket interposed between the first and second members, wherein the first and second members are attached, a gap between the attached first and second members is exposed by the opening formed in the second member, and a dimension of the gap is indicative of a condition of a seal by the gasket of the second member to the first member.

Item 2: In another embodiment, the present disclosure provides the housing assembly of Item 1 wherein the dimension of the gap having a value less than or equal to a threshold value indicates the condition of the seal by the gasket is satisfactory.

Item 3: In another embodiment, the present disclosure provides the housing assembly of any of Items 1 or 2 wherein the first member is a base and second member is a cover, and wherein each of the first member and the second member comprises a surface contacting the gasket.

Item 4: In another embodiment, the present disclosure provides the housing assembly of any of Items 1-3 wherein the gap is formed between the surfaces of the first and second members.

Item 5: In another embodiment, the present disclosure provides the housing assembly of any of Items 1-4 wherein the opening formed in the second member is located such that contact between the gasket and the first and second members is unaffected by the opening.

Item 6: In another embodiment, the present disclosure provides the housing assembly of any of Items 1-5 wherein an image of the gap is captured through the opening from an exterior of the housing after attachment of the first and second members.

Item 7: In another embodiment, the present disclosure provides the housing assembly of any of Items 1-6 wherein the dimension of the gap is measured from the captured image.

Item 8: In another embodiment, the present disclosure provides the housing assembly of any of Items 1-7 wherein attachment of the first and second members compresses the gasket, and wherein the dimension of the gap represents a compression percentage of the gasket.

Item 9: In another embodiment, the present disclosure provides the housing assembly of any of Items 1-8 wherein the second member comprises a deformable flap and the first member has a cavity formed therein, and wherein the deformable flap and the cavity cooperate to attach the first and second members.

Item 10: In another embodiment, the present disclosure provides the housing assembly of any of Items 1-9 wherein the deformable flap is received by the cavity.

Item 11: According to an embodiment, the present disclosure provides a method comprising interposing a gasket between a first housing member and a second housing member, the second housing member having an opening formed therein, attaching the first and second housing members, wherein a gap between the attached first and second housing members is exposed by the opening in the second housing member, and determining a dimension of the gap exposed by the opening, wherein the determined dimension of the gap is indicative of a condition of a seal by the gasket of the second housing member to the first housing member.

Item 12: In another embodiment, the present disclosure provides the method of Item 11 wherein the determined dimension of the gap having a value less than or equal to a threshold value indicates the condition of the seal by the gasket of the second is satisfactory.

Item 13: In another embodiment, the present disclosure provides the method of any of Items 11 or 12 wherein the first housing member is a base and the second housing member is a cover, and wherein the each of the first housing member and the second housing member comprises a surface to contact the gasket.

Item 14: In another embodiment, the present disclosure provides the method of any of Items 11-13 further comprising forming the gap between the surface of the first housing member and the surface of the second housing member.

Item 15: In another embodiment, the present disclosure provides the method of any of Items 11-14 further comprising forming the opening in the second housing member at a location such that contact between the gasket and the first and second housing members is unaffected by the opening.

Item 16: In another embodiment, the present disclosure provides the method of any of Items 11-15 further comprising capturing an image of the gap through the opening from an exterior of a housing formed by attaching the first and second housing members.

Item 17: In another embodiment, the present disclosure provides the method of any of Items 11-16 further comprising measuring the dimension of the gap from the captured image.

Item 18: In another embodiment, the present disclosure provides the method of any of Items 11-17 wherein attaching the first and second housing members comprises compressing the gasket, and wherein the determined dimension of the gap represents a compression percentage of the gasket.

Item 19: In another embodiment, the present disclosure provides the method of any of Items 11-18 further comprising providing a deformable flap on the second housing member, and forming a cavity in the first housing member, wherein attaching the first and second housing members comprises bending the flap into the cavity.

Item 20: In another embodiment, the present disclosure provides a housing formed, manufactured, or assembled according to the method of any of Items 11-19.

While exemplary embodiments are described above, it is not intended that these embodiments describe all possible forms according to the disclosure. In that regard, the words used in the specification are words of description rather than limitation, and it is understood that various changes may be made without departing from the spirit and scope of the disclosure. Additionally, unless the context clearly indicates otherwise, the various features, elements, components, methods, procedures, steps, and/or functions of various implementing embodiments may be combined or utilized in any combination or combinations and/or may be performed in any order other than those specifically described herein to form further embodiments according to the present disclosure.

What is claimed is:

1. A housing assembly comprising:
   a first member;
   a second member having an opening formed therein; and
   a gasket interposed between the first and second members;
   wherein the first and second members are attached, a gap between the attached first and second members is exposed by the opening formed in the second member, and a dimension of the gap is indicative of a condition of a seal by the gasket of the second member to the first member.

2. The housing assembly of claim 1 wherein the dimension of the gap having a value less than or equal to a threshold value indicates the condition of the seal by the gasket is satisfactory.

3. The housing assembly of claim 1 wherein the first member is a base and second member is a cover, and wherein each of the first member and the second member comprises a surface contacting the gasket.

4. The housing assembly of claim 3 wherein the gap is formed between the surfaces of the first and second members.

5. The housing assembly of claim 1 wherein the opening formed in the second member is located such that contact between the gasket and the first and second members is unaffected by the opening.

6. The housing assembly of claim 1 wherein an image of the gap is captured through the opening from an exterior of the housing after attachment of the first and second members.

7. The housing assembly of claim 6 wherein the dimension of the gap is measured from the captured image.

8. The housing assembly of claim 1 wherein attachment of the first and second members compresses the gasket, and wherein the dimension of the gap represents a compression percentage of the gasket.

9. The housing assembly of claim 1 wherein the second member comprises a deformable flap and the first member has a cavity formed therein, and wherein the deformable flap and the cavity cooperate to attach the first and second members.

10. The housing assembly of claim 9 wherein the deformable flap is received by the cavity.

11. A method comprising:
    interposing a gasket between a first housing member and a second housing member, the second housing member having an opening formed therein;
    attaching the first and second housing members, wherein a gap between the attached first and second housing members is exposed by the opening in the second housing member; and
    determining a dimension of the gap exposed by the opening, wherein the determined dimension of the gap is indicative of a condition of a seal by the gasket of the second housing member to the first housing member.

12. The method of claim 11 wherein the determined dimension of the gap having a value less than or equal to a threshold value indicates the condition of the seal by the gasket of the second is satisfactory.

13. The method of claim 11 wherein the first housing member is a base and the second housing member is a cover, and wherein the each of the first housing member and the second housing member comprises a surface to contact the gasket.

14. The method of claim 13 further comprising forming the gap between the surface of the first housing member and the surface of the second housing member.

15. The method of claim 11 further comprising forming the opening in the second housing member at a location such that contact between the gasket and the first and second housing members is unaffected by the opening.

16. The method of claim 11 further comprising capturing an image of the gap through the opening from an exterior of a housing formed by attaching the first and second housing members.

17. The method of claim 16 further comprising measuring the dimension of the gap from the captured image.

18. The method of claim 11 wherein attaching the first and second housing members comprises compressing the gasket, and wherein the determined dimension of the gap represents a compression percentage of the gasket.

19. The method of claim 11 further comprising:
    providing a deformable flap on the second housing member; and forming a cavity in the first housing member;
    wherein attaching the first and second housing members comprises bending the flap into the cavity.

20. A housing manufactured according to the method of claim 11.

* * * * *